(12) United States Patent
Ko

(10) Patent No.: US 12,538,813 B2
(45) Date of Patent: Jan. 27, 2026

(54) LEADFRAME WITH SACRIFICIAL ANODE

(71) Applicant: ADVANCED ASSEMBLY MATERIALS ANHUI LIMITED, Anhui (CN)

(72) Inventor: Ching Leung Lawrence Ko, Shatin (HK)

(73) Assignee: ADVANCED ASSEMBLY MATERIALS ANHUI LIMITED, Anhui (CN)

( * ) Notice: Subject to any disclaimer, the term of this patent is extended or adjusted under 35 U.S.C. 154(b) by 391 days.

(21) Appl. No.: 18/188,350

(22) Filed: Mar. 22, 2023

(65) Prior Publication Data
US 2024/0297103 A1      Sep. 5, 2024

(30) Foreign Application Priority Data
Mar. 3, 2023   (CN) .......................... 202320428772.X

(51) Int. Cl.
 *H01L 23/495*       (2006.01)
(52) U.S. Cl.
 CPC .. *H01L 23/49582* (2013.01); *H01L 23/49541* (2013.01)

(58) Field of Classification Search
 CPC ................................................. H01L 23/49582
 USPC ......................................................... 257/666
 See application file for complete search history.

(56) References Cited

U.S. PATENT DOCUMENTS

2005/0077598 A1*   4/2005  Goh .................. H01L 23/49582
                                                    257/676
2021/0028125 A1*   1/2021  Dangelmaier ........ H01L 21/565

* cited by examiner

*Primary Examiner* — Ajay Arora
(74) *Attorney, Agent, or Firm* — Merchant & Gould P.C.

(57) ABSTRACT

A leadframe (10) comprises: a functional area (12) having a first standard electrode potential; and a non-functional area (14) adjacent to the functional area (12) and including a protective layer, the protective layer (16) having a second standard electrode potential lower than the first standard electrode potential and acting as a sacrificial anode to protect the functional area (12) as a cathode from corrosion/oxidation. Embodiments of the present disclosure may help to protect functions of the leadframe (10) from affections of corrosion/oxidization, etc.

20 Claims, 3 Drawing Sheets

LEADFRAME WITH SACRIFICIAL ANODE

CROSS-REFERENCE TO RELATED APPLICATIONS

This application claims the benefit of priority to Chinese Patent Application No. 202320428772.X, filed on Mar. 3, 2023, the entire disclosure of which are incorporated herein by reference.

TECHNICAL FIELD

The present disclosure generally relates to the technical field of integrated circuits, and more particularly to a leadframe.

BACKGROUND

Leadframe is chips carrier of many integrated circuits. The shelf life of a leadframe is largely affected by the oxidation/corrosion of the leadframe. Minor oxidation/corrosion of the leadframe may severely affect the bondability of medium or affect the signal transition in the bonded medium.

Conventional solutions to the oxidation/corrosion of the leadframe are somewhat unsatisfactory. For example, changing the alloying condition of the leadframe may also affect other properties of the leadframe.

In view of the above, a new leadframe is desirable.

SUMMARY

According to one aspect of embodiments of the present disclosure, a leadframe comprises: a functional area having a first standard electrode potential; and a non-functional area adjacent to the functional area and including a protective layer, the protective layer having a second standard electrode potential lower than the first standard electrode potential and acting as a sacrificial anode to protect the functional area as a cathode from corrosion/oxidation.

In some embodiments, the protective layer comprises a plurality of protrusions protruding with respect to the functional area.

In some embodiments, the plurality of protrusions are columnar, conical, dendritic.

In some embodiments, the protective layer is an electroplated layer.

In some embodiments, the first standard electrode potential is in a range of from −0.5V to 0.8V, by using Standard Hydrogen Electrode.

In some embodiments, the second standard electrode potential is in a range of from −3.5V to −0.7V, by using Standard Hydrogen Electrode.

In some embodiments, the functional area comprises Copper or Iron, and the protective layer comprises at least one of Aluminium, Barium, Beryllium, Calcium, Cesium, Francium, Lithium, Magnesium, Potassium, Radium, Rubidium, Sodium, Strontium, and Zinc.

In some embodiments, the functional area comprises a Copper alloy or an Iron alloy, and the protective layer comprises at least one of Aluminium, Barium, Beryllium, Calcium, Cesium, Francium, Lithium, Magnesium, Potassium, Radium, Rubidium, Sodium, Strontium, and Zinc.

In some embodiments, the non-functional area is separable from the functional area.

In some embodiments, the non-functional area is distributed around the functional area.

As long as technical conditions permit, technical features of various embodiments of the present disclosure may be combined to constitute new embodiments not disclosed herein and within the protection scope.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

DETAILED DESCRIPTION

Figure 1:
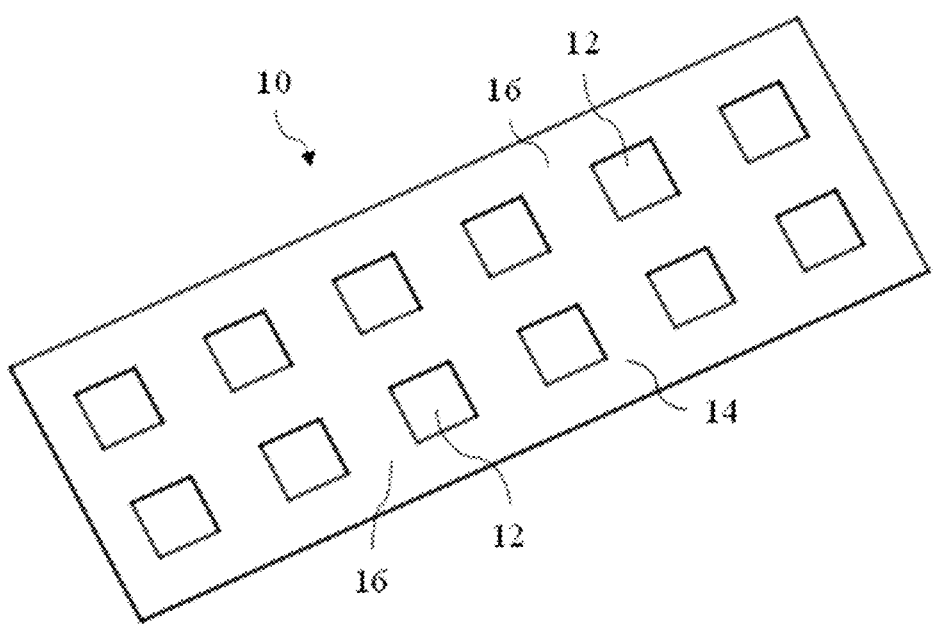
FIG. 1 illustrates a schematic perspective view of a leadframe according to one aspect of embodiments of the present disclosure.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated and make part of this disclosure.

FIG. 1 illustrates a schematic perspective view of a leadframe according to one aspect of embodiments of the present disclosure. Referring to FIG. 1, according to one aspect of embodiments of the present disclosure, a leadframe 10 comprises: a functional area 12 having a first standard electrode potential; and a non-functional area 14 adjacent to the functional area 12 and including a protective layer 16, the protective layer 16 having a second standard electrode potential lower than the first standard electrode potential and acting as a sacrificial anode to protect the functional area 12 as a cathode from corrosion/oxidation.

In embodiments of the present application, the leadframe 10 may be a rectangular sheet, and may include multiple functional areas 12. The functional area 12 may be square. The functional area 12 may be one of basic parts of an integrated circuit (IC). The function of the functional area 12 may include fixing IC, providing a mechanical carrier, protecting inner component(s), transmitting electric signal, etc. The functional area 12 may subject to corrosion/oxidization when exposed in the environment, e.g., after a period of time without protection and/or when the protection, if any, fails.

The non-functional area 14 may be the part of the leadframe 10 that is other than the functional area 12. The non-functional area 14 may be the part of the leadframe 10 that does not bear the function of fixing IC, providing a mechanical carrier, protecting internal component(s), transmitting electric signals, and the like. The non-functional area 14 may connect a plurality of the functional areas 12. The non-functional area 14 may separate a plurality of the functional areas 12. The non-functional area 14 may cover part or all of the functional area 12 during the storage and/or transportation of the leadframe 10.

The non-functional area 14 is adjacent to the functional area 12, the second standard electrode potential of the material of the protective layer 16 is lower than the first standard electrode potential of the material of the functional area 12, and the protective layer 16 tends to release electron before the functional area 12 and react with the oxygen and/or corrosion material(s). In other words, the protective layer 16 acts as a sacrificial anode and "attracts" the corrosion/oxidization to them rather than the functional area 12. The functional area 12 becomes the cathode and does not corrode/oxidize before the protective layer 16, thereby being protected by the protective layer 16 from corrosion/oxidization. In this way, the function of the leadframe 10 is not affected by corrosion/oxidation.

In embodiments of the present disclosure, the non-functional area 14 adjacent to the functional area 12 has the protective layer 16, the alloying condition of the functional area 12 does not need to be changed, so material properties, such as mechanical, electrical, thermal, etc. properties of the functional area 12 are not affected, while being protected by the by the protective layer 16.

In embodiments of the present disclosure, the non-functional area 14 is adjacent to the functional area 12, has the protective layer 16, and does not interfere with the functional area 12 in functioning, handling, moving etc. while protecting the functional area 12.

On the other hand, if a protection material, e.g., in a form of pin is inserted into. e.g., a hole of a leadframe, the pin in the hole hinders the functioning, handling, moving, molding, automatic visual inspection (AVI), etc. of the leadframe. For example, the insertion and retreat of the pin may deform the hole, thereby affecting the inspection accuracy of AVI. In addition, the insertion of the pin into the hole and/or the retreat of the pin from the hole needs additional processing cost, so it is not economical and undesirable for most, if not all, players in the IC industry.

The protective layer 16 may be the surface layer of the non-functional area 14. The protective layer 16 may be the layer where the non-functional area 14 is exposed to the environment. In addition to the protection layer 16, the non-functional area 14 may have other layer(s). The non-functional area 14 may also include a part without the protective layer 16. The part of the non-functional area 14 without the protective layer 16 may be used as a conductive medium between the protective layer 16 and the functional area 12, so that the functional area 12 not adjacent to the protective layer 16 may be protected by the protective layer 16, reducing or eliminating the possibility of corrosion/oxidation.

Figure 2:
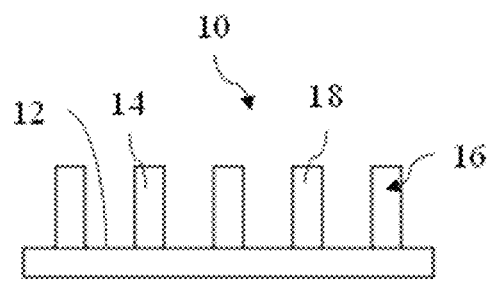
FIG. 2 illustrates a schematic side view of a leadframe according to a first embodiment of the present disclosure.
Figure 3:
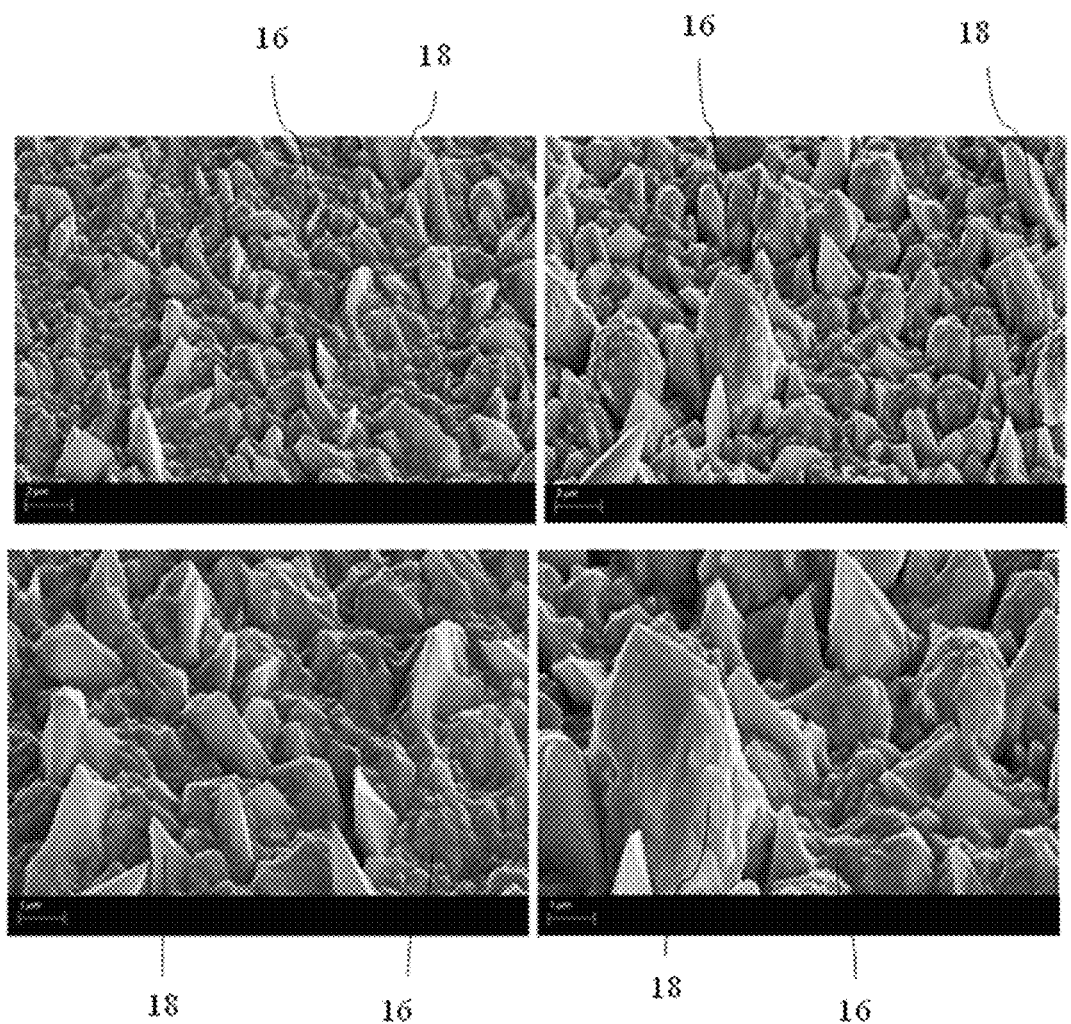
FIG. 3 illustrates a partial electron microscope image of a leadframe according to a second embodiment of the present disclosure.
Figure 4:
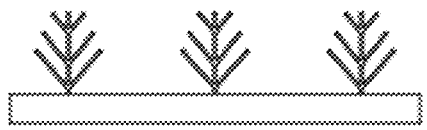
FIG. 4 illustrates a schematic side view of a leadframe according to a third embodiment of the present disclosure.
Figure 5:
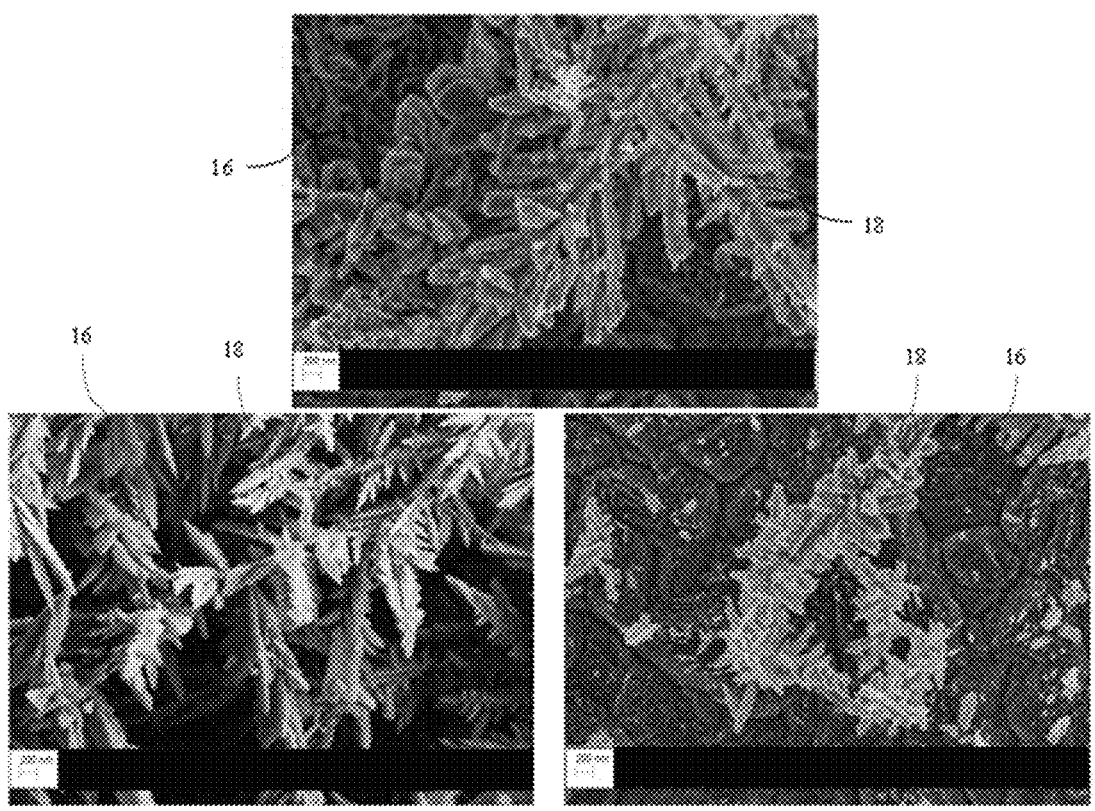
FIG. 5 illustrates a partial electron microscope image of a leadframe according to a fourth embodiment of the present disclosure.

FIG. 2 illustrates a schematic side view of a leadframe according to a first embodiment of the present disclosure; FIG. 3 illustrates a partial electron microscope image of a leadframe according to a second embodiment of the present disclosure; FIG. 4 illustrates a schematic side view of a leadframe according to a third embodiment of the present disclosure; and FIG. 5 illustrates a partial electron microscope image of a leadframe according to a fourth embodiment of the present disclosure.

As is shown in FIGS. 2-5, the protective layer 16 may be more prominent in the environment than the surface of the functional area 12. In some embodiments, the protective layer 16 comprises a plurality of protrusions 18 protruding with respect to the functional area 12.

The shapes of the plurality of protrusions 18 may vary with the formation process type, route, parameters, etc. of the protective layer 16. In some embodiments, the plurality of protrusions are columnar, conical, dendritic.

The protective layer 16 may include columnar, conical, and/or dendritic protrusions 18.

The protective layer 16 in FIG. 2 includes a plurality of columnar protrusions 18.

Referring to FIG. 3, under an electron microscope, the protective layer 16 comprises a plurality of conical protrusions 18 which are generally smaller at the top and larger at the bottom.

As is shown in FIGS. 4 and 5, the protective layer 16 comprises a plurality of protrusions 18 which are substantially dendritic.

The protective layer 16 may be formed by various processes, thus having corresponding shapes, structures, etc. In some embodiments, the protective layer 16 is an electroplated layer. The protective layer 16 may be a layer formed by electroplating, that is, an electroplated layer, so as to firmly adhere to other, if any, layer(s) of the non-functional area 14 and/or the functional area 12.

In some embodiments, a semi-finished product of the leadframe 10 may be masked and/or Laser Direct Imaged (LDI), electroplated, to obtain the electroplated protective layer 16 on part or all of the surface of the non-functional area 14.

In embodiments of the present disclosure, the functional area 12 may comprise metal or metal alloy. In embodiments of the present disclosure, the protective layer 16 may comprise material more reactive in corrosion/oxidization than the functional area 12. The protective layer 16 may comprise metal. The protective layer 16 may comprise Alkali metal and/or Alkaline earth metal. Parts, if any, of the non-functional area 14 other than the protective layer 16 may be made of the same material as the functional area 12.

In some embodiments, the functional area 12 comprises Copper or Iron, and the protective layer 16 comprises at least one of Aluminium, Barium, Beryllium, Calcium, Cesium, Francium, Lithium, Magnesium, Potassium, Radium, Rubidium, Sodium, Strontium, and Zinc.

In some embodiments, the functional area 12 comprises a Copper alloy or an Iron alloy, and the protective layer 16 comprises at least one of Aluminium, Barium, Beryllium, Calcium, Cesium, Francium, Lithium, Magnesium, Potassium, Radium, Rubidium, Sodium, Strontium, and Zinc.

The numerical value of the first standard electrode potential may be different based on the specific material of the functional area 12, the type of standard electrode, the temperature, etc.

In some embodiments, the first standard electrode potential is in a range of from −0.5V to 0.8V, by using Standard Hydrogen Electrode.

For example, by using Standard Hydrogen Electrode at 25° C. i.e., where Hydrogen has a standard electrode potential of 0V in the reduction half-reaction of $2H^+(aq)+2e^-\rightarrow H_2$ (g), Copper has a standard electrode potential of 0.34V in the reduction half-reaction of $Cu^{2+}(aq)+2e^-\rightarrow Cu(s)$, Iron has a standard electrode potential of −0.45V in the reduction half-reaction of $Fe^{2+}(aq)+2e^-\rightarrow Fe(s)$ or 0.77V in the reduction half-reaction of $Fe^{3+}(aq)+e^-\rightarrow Fe^{2+}(aq)$.

Unless otherwise specified, numerical values in this disclosure include measurement, accuracy, metering and other errors, such as errors within ±5%. For example, −0.5 may include values in the range of −0.525 to −0.475.

Unless otherwise specified, the numerical range in this application includes any sub range therein, for example, −0.5 to 0.8 may include −0.4 to 0.8, −0.3 to 0.8, −0.2 to 0.8, −0.1 to 0.8, −0.5 to 0.7, −0.5 to 0.6, −0.5 to 0.5, −0.5 to 0.4, −0.5 to 0.3, −0.5 to 0.2, and so on.

The numerical value of the second standard electrode potential may be different based on the specific material of the protective layer 16, the type of standard electrode, the temperature, etc.

In some embodiments, the second standard electrode potential is in a range of from −3.5V to −0.7V, by using Standard Hydrogen Electrode.

For example, by using Standard Hydrogen Electrode at 25° C., i.e., where Hydrogen has a standard electrode potential of 0V in the reduction half-reaction of $2H^+(aq)+2e^-\rightarrow H_2(g)$, Lithium has a standard electrode potential of −3.04V in the reduction half-reaction of $L^+(aq)+e^-\rightarrow Li(s)$, Sodium has a standard electrode potential of −2.71V in the reduction half-reaction of $Na^+(aq)+e\leq\rightarrow Na(s)$, Magnesium has a standard electrode potential of −2.37V in the reduction half-reaction of $Mg^{2+}(aq)+2e^-\rightarrow Mg(s)$, Zinc has a standard electrode potential of −0.76V in the reduction half-reaction of $Zn^{2+}(aq)+2e^-\rightarrow Zn(s)$, and so on.

The second standard electrode potential of the material of the protective layer 16 is lower than the first standard electrode potential of the material of the functional area 12, the protective layer 16 may donate electrons to the functional area 12 to prevent it from oxidization/corrosion. The functional area 12 which is oxidized may be immediately reduced back when receiving the electrons donated by the protective layer 16.

For example, in an embodiment where the protective layer 16 comprises Magnesium (Mg) and the functional area 12 comprises Iron (Fe), the electron donation between the protective layer 16 and the functional area 12 is shown below:

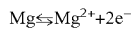

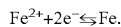

In an experiment of a Zinc protective layer and a Copper functional area, it was found the Zinc protective layer corroded/oxidized first and until the Zinc protective layer massively sacrificed, the level of oxidation/corrosion in the Copper functional area was still industrially acceptable for the later process.

The protective layer 16 may protect the functional area 12 during the storage and transportation of the leadframe 10. In some embodiments, the non-functional area 14 is separable from the functional area 12. When using the functional area 12, the leadframe 10 may be cut to separate the non-functional area 14 and the functional area 12 to use the functional area 12 without corrosion/oxidation or with an acceptable degree of corrosion/oxidation.

In some embodiments, the non-functional area 14 is distributed around the functional area 12. While the protective layer 16 protects the functional area 12 from corrosion/oxidation, the non-functional area 14 distributed around the functional area 12 may provide physical protection for the functional area 12 to prevent the functional area 12 from being damaged during the storage and/or transportation of the leadframe 10. The non-functional area 14 may cover the functional area 12 except the part, if any, that needs to be exposed to the environment. The non-functional area 14 may cover part or all of one or more of the front surface, the rear surface, the left surface, the right surface, the top surface and the bottom surface of the functional area 12.

Unless otherwise specified, terms "front", "rear" "left", "right", "top", "bottom", or the like may refer to the positional arrangement in the drawings and/or in use and are not intended to limit the protection scope in this respect.

As used herein, terms "a", "an", "one", or the like may refer to one or more and are not meant to limit the number unless context dictates otherwise.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

I claim:

1. A leadframe comprising:
a functional area having a first standard electrode potential; and
a non-functional area adjacent to the functional area and including a protective layer, the protective layer having a second standard electrode potential lower than the first standard electrode potential and acting as a sacrificial anode to protect the functional area as a cathode from corrosion/oxidation, wherein when using the functional area, the non-functional area is separable from the functional area by cutting the leadframe.

2. The leadframe according to claim 1, wherein the protective layer comprises a plurality of protrusions protruding with respect to the functional area.

3. The leadframe according to claim 2, wherein the plurality of protrusions have columnar, conical, and/or dendritic shapes.

4. The leadframe according to claim 1, wherein the protective layer is an electroplated layer.

5. The leadframe according to claim 2, wherein the protective layer is an electroplated layer.

6. The leadframe according to claim 3, wherein the protective layer is an electroplated layer.

7. The leadframe according to claim 1, wherein the first standard electrode potential is in a range of from −0.5V to 0.8V, by using Standard Hydrogen Electrode.

8. The leadframe according to claim 2, wherein the first standard electrode potential is in a range of from −0.5V to 0.8V, by using Standard Hydrogen Electrode.

9. The leadframe according to claim 3, wherein the first standard electrode potential is in a range of from −0.5V to 0.8V, by using Standard Hydrogen Electrode.

10. The leadframe according to claim 1, wherein the second standard electrode potential is in a range of from −3.5V to −0.7V, by using Standard Hydrogen Electrode.

11. The leadframe according to claim 2, wherein the second standard electrode potential is in a range of from −3.5V to −0.7V, by using Standard Hydrogen Electrode.

12. The leadframe according to claim 3, wherein the second standard electrode potential is in a range of from −3.5V to −0.7V, by using Standard Hydrogen Electrode.

13. The leadframe according to claim 1, wherein the functional area comprises Copper or Iron, and the protective layer comprises at least one of Aluminium, Barium, Beryllium, Calcium, Cesium, Francium, Lithium, Magnesium, Potassium, Radium, Rubidium, Sodium, Strontium, and Zinc.

14. The leadframe according to claim 1, wherein the functional area comprises a Copper alloy or an Iron alloy, and the protective layer comprises at least one of Aluminium, Barium, Beryllium, Calcium, Cesium, Francium, Lithium, Magnesium, Potassium, Radium, Rubidium, Sodium, Strontium, and Zinc.

15. The leadframe according to claim 1, wherein the non-functional area is distributed around the functional area.

16. The leadframe according to claim 2, wherein the non-functional area is distributed around the functional area.

17. The leadframe according to claim 3, wherein the non-functional area is distributed around the functional area.

18. A method of using the leadframe according to claim 1, comprising: cutting the leadframe to separate the non-functional area and the functional area when using the functional area.

19. The method of using the leadframe according to claim 18, wherein the protective layer comprises a plurality of protrusions protruding with respect to the functional area.

20. The method of using the leadframe according to claim 19, wherein the plurality of protrusions have columnar, conical, and/or dendritic shapes.

* * * * *